United States Patent [19]
Mills et al.

[11] Patent Number: 6,075,694
[45] Date of Patent: *Jun. 13, 2000

[54] DRIVE BAY FOR ALTERNATELY ORIENTABLE COMPUTER CHASSIS

[75] Inventors: R. Steven Mills, Austin; Andrew L. McAnally, Georgetown, both of Tex.

[73] Assignee: Dell USA L.P., Round Rock, Tex.

[ * ] Notice: This patent issued on a continued prosecution application filed under 37 CFR 1.53(d), and is subject to the twenty year patent term provisions of 35 U.S.C. 154(a)(2).

[21] Appl. No.: 08/891,568

[22] Filed: Jul. 11, 1997

[51] Int. Cl.⁷ .................................. G01F 1/16; H05K 7/10
[52] U.S. Cl. ........................... 361/685; 361/683; 361/727; 312/223.2
[58] Field of Search ..................................... 361/685, 683, 361/684, 686, 724, 725, 726, 727, 741, 756, 786, 802; 312/223.2, 223.3; 364/708.1

[56] References Cited

U.S. PATENT DOCUMENTS

| | | | |
|---|---|---|---|
| 5,332,306 | 7/1994 | Babb et al. | 312/334.16 |
| 5,510,955 | 4/1996 | Taesang | 361/685 |
| 5,513,068 | 4/1996 | Girard | 361/685 |
| 5,566,049 | 10/1996 | Nguyen | 361/685 |
| 5,584,396 | 12/1996 | Schmitt | 361/683 |
| 5,668,696 | 9/1997 | Schmitt | 361/685 |
| 5,724,227 | 3/1998 | Hancock et al. | 361/685 |
| 5,726,864 | 3/1998 | Copeland et al. | 361/800 |
| 5,730,515 | 3/1998 | Ho | 312/350 |
| 5,748,442 | 5/1998 | Toor | 361/685 |
| 5,757,617 | 5/1998 | Sherry | 361/685 |
| 5,790,374 | 8/1998 | Wong | 361/685 |
| 5,812,377 | 9/1998 | Golbach | 361/759 |
| 5,822,184 | 10/1998 | Rabinovitz | 361/685 |
| 5,828,547 | 10/1998 | Francovich et al. | 361/685 |
| 5,852,739 | 12/1998 | Radloff et al. | 395/800.01 |

*Primary Examiner*—Max Noori
*Assistant Examiner*—Jagdish Patel
*Attorney, Agent, or Firm*—Skjerven, Morrill, MacPherson, Franklin & Friel, L.L.P.

[57] ABSTRACT

A drive bay for an alternately orientable computer chassis includes a first pair of parallel opposing side panels and a second pair of parallel opposing side panels, each side panel having an interior side surface and an exterior side surface, and a plurality of drive mounting features on the interior side surface of each side panel. The first pair of parallel opposing side panels and the second pair of parallel opposing side panels arranged to form an enclosure with a rectangular aperture. The drive bay allows drives to be mounted horizontally in the drive bay, whether the chassis is in a tower or a desktop/rack orientation, and without having to ever change the orientation of the drive bay with respect to the chassis. Because the drive bay need not be re-mounted when the orientation of the chassis is changed, the drive bay can provide additional structural support to the chassis.

12 Claims, 5 Drawing Sheets

DRIVE BAY FOR ALTERNATELY ORIENTABLE COMPUTER CHASSIS

BACKGROUND OF THE INVENTION

1. Field of the Invention

This invention relates to computer equipment enclosures, particularly, drive enclosures that when mounted to a computer chassis, allow drives to remain horizontal whether the chassis is in a tower or a desktop/rack orientation.

2. Description of the Related Art

Many computer chassis are designed to be used in more than one orientation, for example a vertical orientation (i.e. tower orientation) and a horizontal orientation (i.e. desktop or rack orientation). Problems can occur when the orientation of some computer components within the computer chassis is improper. For instance, some peripheral devices or computer system components (generally referred to as "drives") including disk drives and tape drives perform only in limited orientations. Examples include Quantum Corporation's DLT™ tape backup drive which can only operate in a vertical orientation while on its left side, Iomega Corporation's Zip™ drive which can only operate in a vertical orientation while on its right side, and some CD-ROM drives which only operate in a horizontal orientation. For all of these drives, the simplest solution is to ensure that the drive is mounted in a horizontal orientation, regardless of the orientation of the computer chassis.

Prior art drive bays satisfy this need by being installable in a variety of orientations. For example, U.S. Pat. No. 5,513,068, entitled "Computer Case with Adjustable Drive Housing for Interchangeable Desktop/Tower Configuration and Control Panel Attachable to the Drive Housing," discloses a computer case which can be used in either a desktop or tower orientation while maintaining drives horizontal to the support surface on which the case rests, in either orientation. FIG. 1 shows such a prior art drive bay 100 with mating channels 110 for attaching drives to the housing, and tabs 120 with holes 130 for mounting the drive bay to the front plate of a computer chassis.

With the prior art drive bay of FIG. 1, one must decide in which orientation to mount the drive bay when the computer system is first assembled. This requires the chassis to be configured at the factory, and the orientation of the drive bay will depend upon the desired orientation of the computer chassis. If the computer system is already assembled in one orientation, and the user wishes to change that orientation, the user must perform a number of steps. First, the bezel, hood, or front face of the computer case must be removed. Then the drives must be disconnected from their cables and removed from the drive bay. Next, the drive bay is reoriented, allowing the drives to lie in a horizontal orientation with respect to the computer system's new orientation. The drives are reoriented, installed in the housing, and reconnected to their cables. Finally, the bezel, hood, or front face of the computer case is replaced. Both the "first assembled" and the "subsequent reorientation" scenarios present added and unwanted steps to computer system configuration.

Additionally, the prior art bay of FIG. 1 is designed to be mounted to the front plate of a computer chassis so that the bay can more easily be mounted in either of its horizontal or vertical orientations. However, chassis with the drive bay mounted to the front plate are structurally weaker than they need be because advantage is not taken of the added structure of the drive housing.

Accordingly, it is desirable to have a drive bay for a computer chassis that allows drives to be mounted horizontally with respect to the support surface on which the chassis rests, regardless of the orientation of the drive bay or the computer chassis. Additionally, it is desirable to have such a drive bay that enhances the structural integrity of the chassis in which it is mounted.

SUMMARY OF THE INVENTION

It has been discovered that a drive bay with a plurality of drive mounting features on each interior side of the drive bay's panels allows drives to be mounted horizontally in the drive bay, whether the computer chassis is in a tower or a desktop/rack orientation, and without changing the orientation of the drive bay with respect to the chassis. Additionally, because the drive bay is not re-mounted to change the orientation of the chassis, the drive bay provides additional structural support to the chassis.

Accordingly, one aspect of the present invention provides a drive bay for an alternately orientable computer chassis. The drive bay includes a first pair of parallel opposing side panels and a second pair of parallel opposing side panels. Each side panel has an interior side surface and an exterior side surface. The first pair of parallel opposing side panels and the second pair of parallel opposing side panels are arranged to form an enclosure with a rectangular aperture. A plurality of drive mounting features are located on the interior side surface of each side panel.

In another aspect of the invention, a computer system includes a processor, a memory coupled to the processor, an alternately orientable chassis supporting the processor and the memory, and a drive bay mounted to the alternately orientable chassis. The drive bay, in turn, includes a first pair of parallel opposing side panels and a second pair of parallel opposing side panels. Each side panel has an interior side surface and an exterior side surface. The first pair of parallel opposing side panels and the second pair of parallel opposing side panels are arranged to form an enclosure with a rectangular aperture. A plurality of drive mounting features are located on the interior side surface of each side panel.

In another aspect of the invention, a method of changing a computer chassis' orientation is disclosed. The method includes providing an alternately orientable computer chassis including, a front cover, a drive bay, and a drive mounted in the drive bay in a first orientation. The drive bay further includes a first pair of parallel opposing side panels are and a second pair of parallel opposing side panels. Each side panel has an interior side surface and an exterior side surface. The first pair of parallel opposing side panels and the second pair of parallel opposing side panels arranged to form an enclosure with a substantially square aperture, and each side panel has a plurality of drive mounting features on the interior side surface. The method further includes the steps of removing the front cover of the chassis, removing the drive, installing the drive in the drive bay in a second orientation, and installing the front cover.

BRIEF DESCRIPTION OF THE DRAWINGS

The present invention may be better understood, and its numerous objects, features, and advantages made apparent to those skilled in the art by referencing the accompanying drawings.

DETAILED DESCRIPTION

Figure 1:
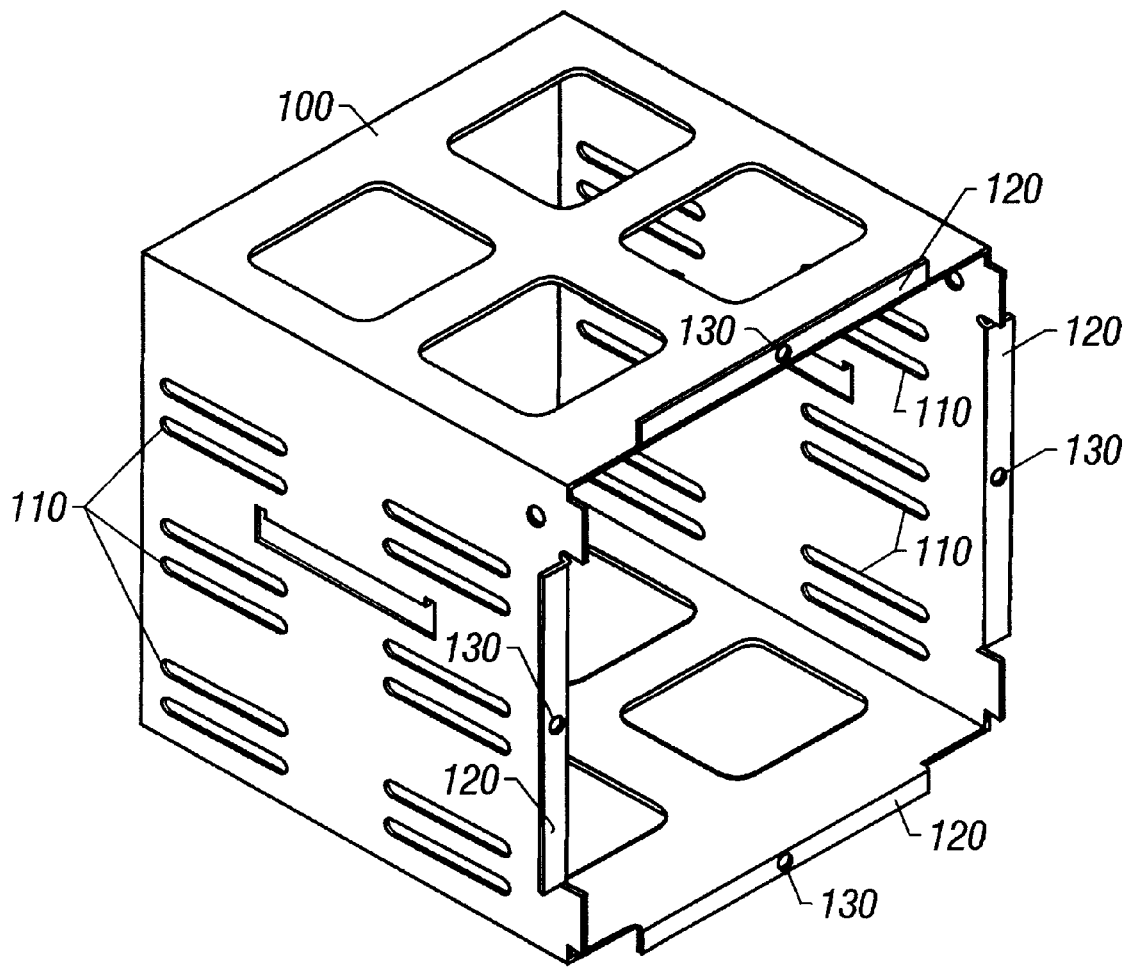
FIG. 1 is a perspective view of a prior art drive bay.
Figure 2:
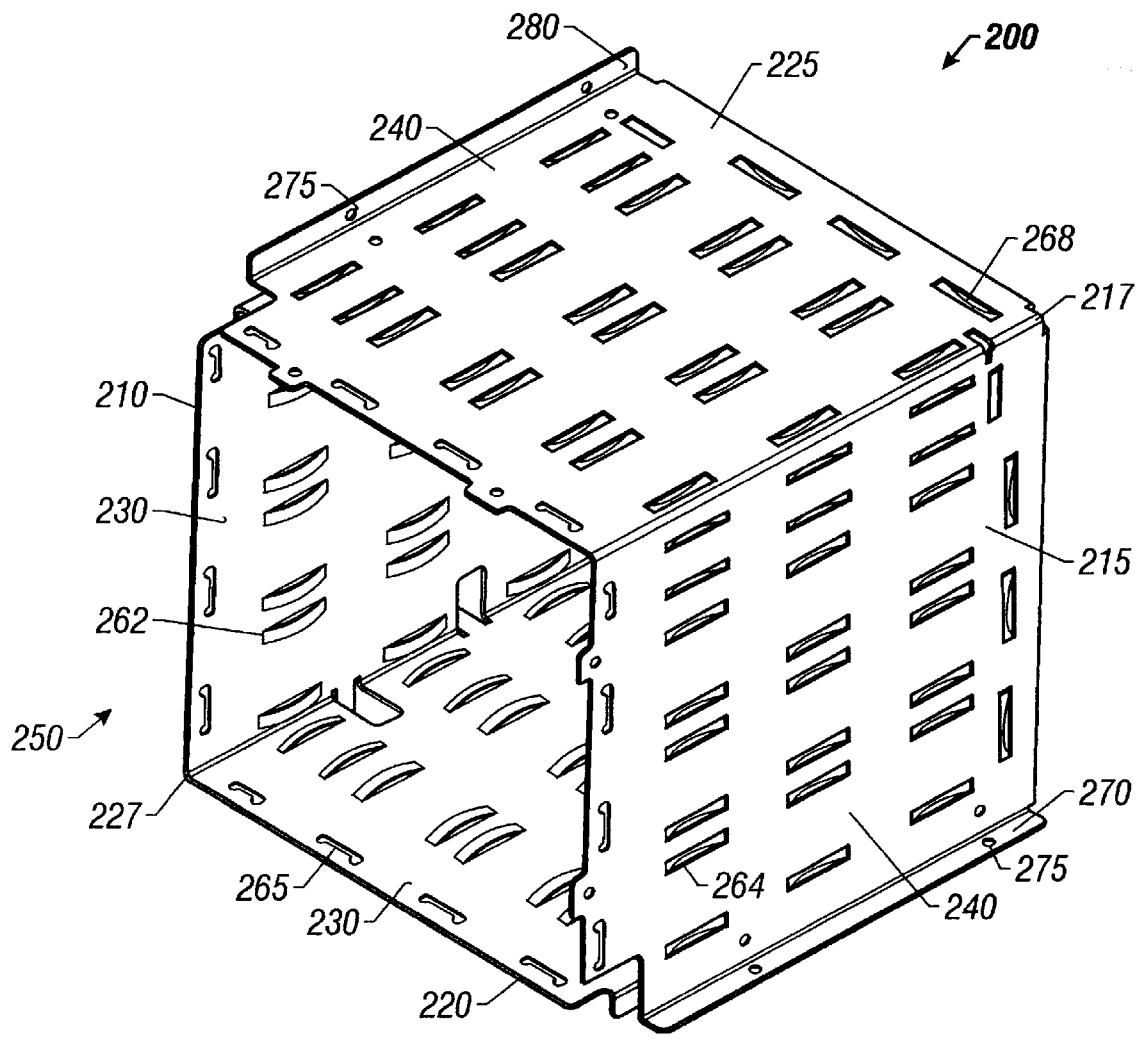
FIG. 2 is a perspective view of the drive bay for an alternately orientable computer chassis of the present invention.

The drive bay for an alternately orientable computer chassis of the present invention is shown in FIG. 2. Drive bay 200 includes a first pair of parallel opposing side panels 210 and 215, and a second pair of parallel opposing side panels 220 and 225. The side panels are arranged to form a box-like drive bay enclosure, with an aperture 250 to allow insertion and removal of one or more drives. The side of the drive bay opposite aperture 250 can alternately be an aperture or another panel, depending upon the requirements of the drive bay or the chassis in which the drive bay is mounted. The first pair of parallel opposing side panels and the second pair of parallel opposing side panels of drive bay 200 can have different widths, and thus aperture 250 is generally rectangular. Where the first pair of parallel opposing side panels and the second pair of parallel opposing side panels have substantially the same width, as seen in FIG. 2, the generally rectangular aperture drive bay is a substantially square aperture so that a drive that fits into the drive bay in one orientation also fits in the drive bay in another orientation, without adding or removing drive mounting hardware. Additionally, the drive bay can be constructed from a number of separate side panels (e.g. four) joined together, or the drive bay can be constructed from several side panel assemblies. For example, drive bay 200 is assembled from side panel assemblies 217 and 227 which are each formed from a single piece of panel material consisting of side panels 215 and 225, and 210 and 220, respectively. The drive bay can be constructed from a variety of different panel materials including metals and plastics.

Each panel of drive bay 200 has an interior side surface 230 and an exterior side surface 240. A plurality of drive mounting features 262, 264, 266, and 268 are located on each interior side surface 230 of each of the side panels 210, 215, 220, and 225. The drive mounting features shown in FIG. 2 include a plurality of lance strips. Each lance strip on a side panel corresponds to a lance strip on the interior side surface of the opposite side panel. For example, lance strip 262 on side panel 210 corresponds to lance strip 264 on side panel 215. The lance strips are arranged in several rows to accommodate several different drives installed in the drive bay. The lance strips serve to guide the drive into the drive bay and support it once inserted. Other drive mounting features include front stops 266 and back stops 268. In drive bay 200, front stops 266 are slots for receiving tabs on the rails of a drive inserted into the bay, and back stops 268 are lance strips. Other embodiments of drive bay 200 can have different drive mounting features including, for example, elongated slots, channels, rails, and clips. Moreover, each drive mounting feature need not be the same.

Mounting brackets 270 and 280 allow drive bay 200 to be mounted to the chassis of a computer system. Mounting brackets 270 and 280 are shown as outwardly projecting tabs with mounting holes 275, and the tabs are located at the edges of two side panels that are perpendicular to each other. Alternately, the mounting brackets can be located at the back end (ie. side the opposite the drive insertion end) of the drive bay, or wherever appropriate to facilitate mounting the drive bay to a chassis. Additionally, one or more mounting brackets may be used, although two mounting brackets are shown. Mounting brackets 270 and 280 can utilize a variety of different fasteners to secure the drive bay to the computer chassis, including screws, bolts, rivets and clips. Alternately, the drive bay may be permanently attached to a computer chassis by welding or some other suitable joining technique.

Figure 3:
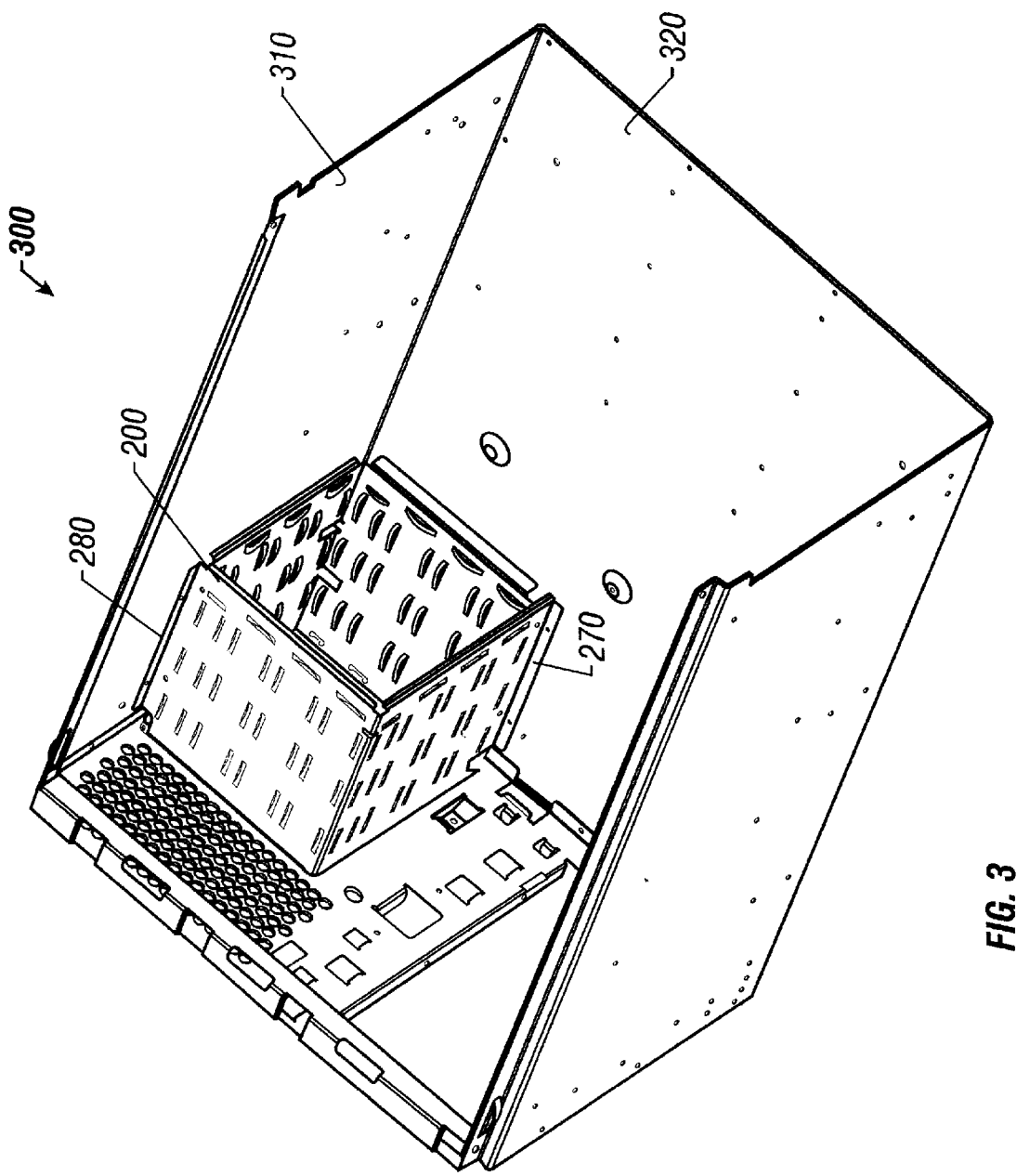
FIG. 3 illustrates the drive bay of the present invention mounted in an alternately orientable computer chassis.

FIG. 3 illustrates the drive bay of the present invention mounted in an alternately orientable computer chassis 300. Mounting bracket 280 attaches to chassis side wall 310, and mounting bracket 270 attaches to chassis bottom wall 320. Because of the location of mounting brackets 270 and 280, and the fact that each mounting bracket is mounted to a different wall of the computer chassis, drive bay 200 adds structural support to chassis 300. In computer chassis 300, the drive bay 200 acts as a brace or corner support for the entire chassis, advantageously contributing additional structural integrity to the chassis. A variety of different mounting bracket locations and configurations can be used to achieve the desired chassis stability and still allow the drive bay to support horizontal mounting of drive when the chassis is in either the tower or desktop/rack orientation. Because the drive bay does not require re-mounting to change the orientation of the chassis, as in prior art drive bays, the drive bay can be permanently attached to the computer chassis.

Figure 4:
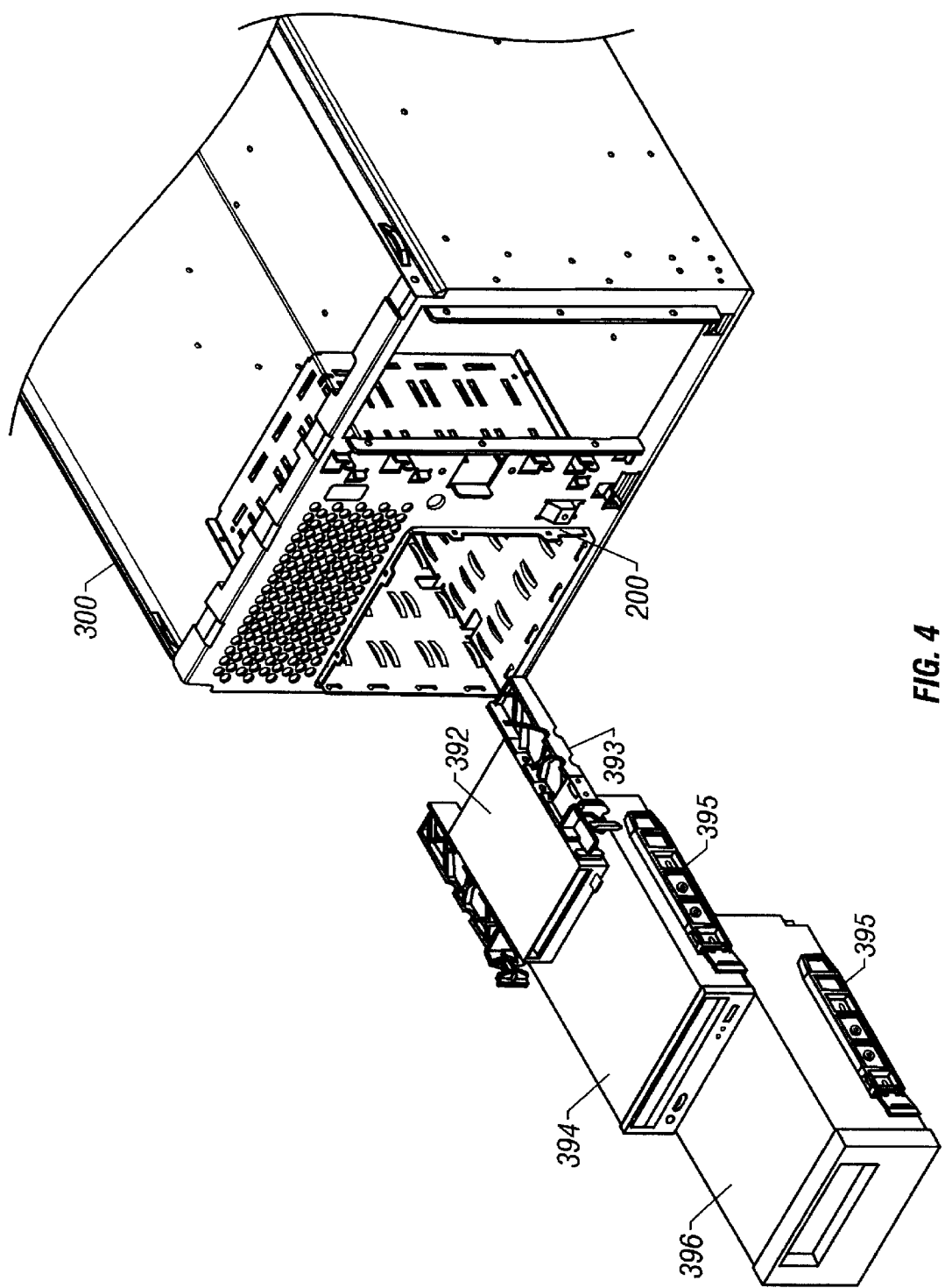
FIG. 4 illustrates a horizontally or desktop oriented computer chassis of the present invention, including a drive bay and drives.
Figure 5:
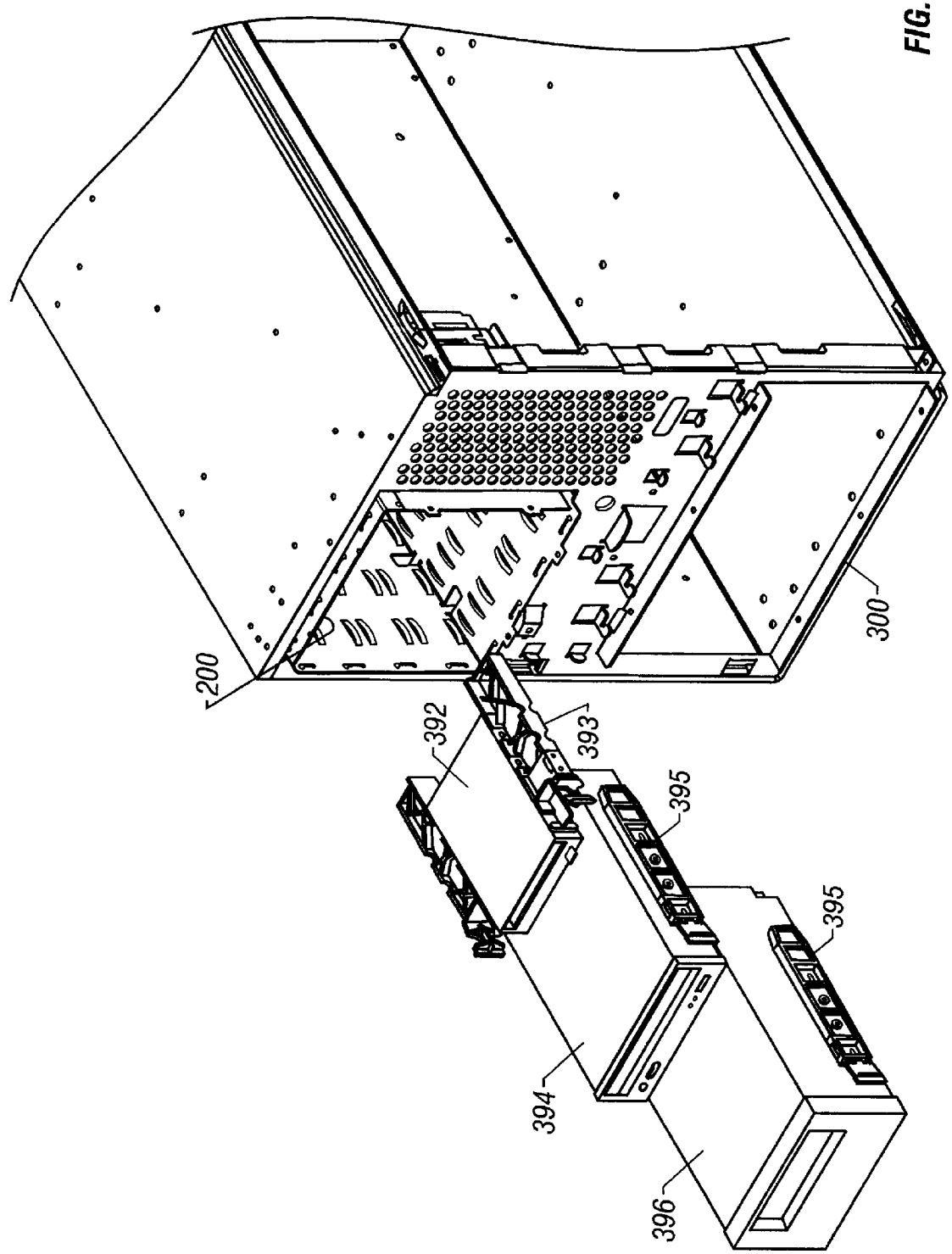
FIG. 5 illustrates a vertically or tower oriented computer chassis of the present invention, including a drive bay and drives.

FIGS. 4 and 5 show drive bay 200 accommodating drives 392, 394, and 396 in a horizontal orientation when the alternately orientable computer chassis 300 is in either a desktop/rack orientation (FIG. 4) or a tower orientation (FIG. 5). FIGS. 4 and 5 show drives 392, 394, and 396 as a floppy disk drive, a CD-ROM drive, and a tape backup drive, respectively, however any manner of tape drive, disk drive, peripheral device, or computer system component can be mounted in the drive bay. The drives include various rails 393 and 395 allowing the drive to be mounted into the bay using the drive mounting features. Whether in the desktop/rack or tower orientation, no change to the drive bay is required in order to accommodate the drives' horizontal orientation. Thus, drive bay 200 is an advantageous element of a computer system that includes a processor, a memory coupled to the processor, an alternately orientable chassis, and one or more drives. Furthermore, because of the drive bay's versatility, several time consuming steps can be eliminated from a process that changes the computer chassis' orientation from one orientation to another.

The description of the invention set forth herein is illustrative and is not intended to limit the scope of the invention as set forth in the following claims. Variations and modifications of the embodiments disclosed herein may be made based on the description set forth herein, without departing from the scope and spirit of the invention as set forth in the following claims.

What is claimed is:

1. A computer system comprising:

a processor;

a memory coupled to the processor;

an alternately orientable chassis supporting the processor and the memory; and a drive bay mounted to the alternately orientable chassis, the drive bay further comprising:

a first pair of parallel opposing side panels and a second pair of parallel opposing side panels, each side panel having an interior side surface and an exterior side surface, the first pair of parallel opposing side panels and the second pair of parallel opposing side panels arranged to form an enclosure with a substantially rectangular aperture;

a plurality of drive mounting features on the interior side surface of each side panel, the plurality of drive mounting features arranged in at least one row to accommodate an inserted drive;

a first mounting bracket attached to a selected one of the first pair of parallel opposing side panels, the first mounting bracket being parallel to the at least one row of drive mounting features and attachable to a first wall of the alternately orientable chassis; and a second mounting bracket attached to a selected one of the second pair of parallel opposing side panels, the second mounting bracket being parallel to the at least one row of drive mounting features and attachable to a second wall of the alternately orientable chassis, the first and second mounting bracket being located at opposite corners of the enclosure.

2. The computer system of claim 1 wherein the first mounting bracket located on the drive bay in a first location, the first location corresponding to a receiving location on the alternately orientable chassis, the drive bay adds support to the alternately orientable chassis upon inserting the drive bay.

3. The computer system of claim 1 wherein the substantially rectangular aperture is a substantially square aperture.

4. The computer system of claim 1 wherein the plurality of drive mounting features includes a plurality of lance strips, each lance strip corresponding to a parallel opposing lance strip on the interior side surface of the each side panel.

5. The computer system of claim 1 wherein the plurality of drive mounting features includes a plurality of slots, each slot corresponding to a parallel opposing slot on the interior side surface of the each side panel.

6. The computer system of claim 1 wherein the first mounting bracket is an outwardly projecting tab formed from a selected one of the first pair of parallel opposing side panels, and the second mounting bracket is an outwardly projecting tab formed from a selected one of the second pair of parallel opposing side panels, the first and the second mounting bracket having at least one mounting hole.

7. A drive bay for an alternately orientable computer chassis, the drive bay comprising:

a first pair of parallel opposing side panels and a second pair of parallel opposing side panels, each side panel having an interior side surface and an exterior side surface, the first pair of parallel opposing side panels and the second pair of parallel opposing side panels arranged to form an enclosure with a rectangular aperture;

a plurality of drive mounting features on the interior side surface of each side panel, the plurality of drive mounting features arranged in at least one row to accommodate an inserted drive;

a first mounting bracket attached to a selected one of the first pair of parallel opposing side panels, the first mounting bracket being parallel to the at least one row of the plurality of drive mounting features and attachable to a first wall of a chassis; and a second mounting bracket attached to a selected one of the second pair of parallel opposing side panels, the second mounting bracket being parallel to the at least one row of drive mounting features and attachable to a second wall of the chassis, the first and second mounting bracket being located at opposite corners of the enclosure.

8. The drive bay of claim 1 wherein the first mounting bracket is located on the enclosure in a first location, the first location corresponding to a receiving location on the chassis, the enclosure adds support to the chassis upon inserting the enclosure.

9. The drive bay of claim 1 wherein the rectangular aperture is a substantially square aperture.

10. The drive bay of claim 1 wherein the plurality of drive mounting features includes a plurality of lance strips, each lance strip corresponding to a parallel opposing lance strip on the interior side surface of the each side panel.

11. The drive bay of claim 1 wherein the plurality of drive mounting features includes a plurality of slots, each slot corresponding to a parallel opposing slot on the interior side surface of the each side panel.

12. The drive bay if claim 1 wherein the first mounting bracket is an outwardly projecting tab formed from a selected one of the first pair of parallel opposing side panels, and the second mounting bracket is an outwardly projecting tab formed from a selected one of the second pair of parallel opposing side panels, the first and the second mounting bracket having at least one mounting hole.

* * * * *